United States Patent
Watson et al.

(10) Patent No.: US 7,303,842 B2
(45) Date of Patent: Dec. 4, 2007

(54) SYSTEMS AND METHODS FOR MODIFYING A RETICLE'S OPTICAL PROPERTIES

(75) Inventors: Sterling G. Watson, Palo Alto, CA (US); Ady Levy, Sunnyvale, CA (US); Chris A. Mack, Austin, TX (US); Stanley E. Stokowski, Danville, CA (US); Zain K. Saidin, San Mateo, CA (US); Larry S. Zurbrick, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/394,901

(22) Filed: Mar. 31, 2006

(65) Prior Publication Data

US 2006/0234139 A1 Oct. 19, 2006

Related U.S. Application Data

(60) Provisional application No. 60/671,293, filed on Apr. 13, 2005, provisional application No. 60/758,576, filed on Jan. 11, 2006.

(51) Int. Cl.
*G03F 9/00* (2006.01)
(52) U.S. Cl. .............................. 430/5; 430/30; 430/945
(58) Field of Classification Search .................. 430/5, 430/30, 945
See application file for complete search history.

(56) References Cited

U.S. PATENT DOCUMENTS

| | | | |
|---|---|---|---|
| 6,516,085 B1 | 2/2003 | Wiley et al. | |
| 6,654,489 B2 | 11/2003 | Wiley et al. | |
| 7,123,356 B1 | 10/2006 | Stokowski et al. | |
| 2004/0009416 A1 | 1/2004 | Peterson et al. | |
| 2004/0091142 A1 | 5/2004 | Peterson et al. | |
| 2005/0084767 A1* | 4/2005 | Zait et al. ................. | 430/5 |
| 2006/0236294 A1 | 10/2006 | Saidin et al. | |

FOREIGN PATENT DOCUMENTS

WO PCT/IL2004/000653 1/2005

\* cited by examiner

*Primary Examiner*—Christopher G. Young
(74) *Attorney, Agent, or Firm*—Beyer Weaver LLP

(57) ABSTRACT

Disclosed are systems and methods for modifying a reticle. In general, inspection results from a plurality of wafers or prediction results from a lithographic model are used to individually decrease the dose or any other optical property at specific locations of the reticle. In one embodiment, any suitable optical property of the reticle is modified by an optical beam, such as a femto-second laser, at specific locations on the reticle so as to widen the process window for such optical property. Examples of optical properties include dose, phase, illumination angle, and birefringence. Techniques for adjusting optical properties at specific locations on a reticle using an optical beam may be practiced for other purposes besides widening the process window.

39 Claims, 11 Drawing Sheets

SYSTEMS AND METHODS FOR MODIFYING A RETICLE'S OPTICAL PROPERTIES

RELATED APPLICATION DATA

The present application claims priority under 35 U.S.C. 119(e) to U.S. Provisional Patent Application No. 60/671,293, filed Apr. 13, 2005, and U.S. Provisional Patent Application No. 60/758,576, filed Jan. 11, 2006, the entire disclosures of both which are incorporated herein by reference for all purposes.

FIELD OF THE INVENTION

The invention pertains in general to integrated circuit design and fabrication, and in particular to mitigating actual or potential variations on a patterned wafer.

BACKGROUND

Fabricating semiconductor devices such as logic and memory devices typically includes processing a substrate such as a semiconductor wafer using a number of semiconductor fabrication processes to form various features and multiple levels of the semiconductor devices. For example lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a semiconductor wafer and then separated into individual semiconductor devices.

Lithography is typically one of the most important processes in integrated circuit manufacturing since this is the process in which features are patterned on the wafer. The pattern printed in a resist by lithography is then utilized as a masking layer to transfer the pattern to additional layers on the wafer in subsequent processing steps. Therefore, the pattern than is formed on the wafer during lithography directly affects the features of the integrated circuits that are formed on the wafer. Consequently, defects that are formed on the wafer during lithography may be particularly problematic for the integrated circuit manufacturing process. One of the many ways in which defects may be formed on the patterned wafer during lithography is by transfer of defects that are present on the reticle to the wafer. Therefore, detection and correction of defects on the reticle such as unwanted particulate or other matter is performed rather stringently to prevent as many defects on the reticle from being transferred to the wafer during lithography.

However, as the dimensions of integrated circuits decrease and the patterns being transferred from the reticle to the wafer become more complex, defects or marginalities in the features formed on the reticle become increasingly important. In particular, if the pattern is not formed on the reticle, such discrepancies increasingly produce defects on the wafer as the dimension of the pattern decrease and the complexity of the pattern increases. In addition, marginalities in the reticle design may cause the design to print incorrectly on the wafer. Therefore, significant efforts have been devoted to methods and systems that can be used to detect problems in the pattern on the reticle or in the design that will cause problems on the wafer. These efforts are relatively complex and difficult due, at least in part, to the fact that not all discrepancies or marginalities in the pattern formed on the reticle (as compared to the ideal pattern) will cause errors on the wafer that will adversely affect the integrated circuit. In other words, some error in the pattern formed on the reticle may not produce defects on the wafer at all or may produce defects on the wafer that will not reduce the performance characteristics of the integrated circuit.

Accordingly, improved mechanisms for correcting problems or variations on the patterned wafer are needed.

SUMMARY OF THE INVENTION

Systems and methods for modifying a reticle are disclosed. In general, inspection results from a plurality of wafers or prediction results from a lithographic model are used to individually decrease the dose or any other optical property at specific locations of the reticle. In one embodiment, any suitable optical property of the reticle is modified by an optical beam, such as a femto-second laser, at specific locations on the reticle so as to widen the lithography process window for such optical property. Examples of optical properties include dose, phase, illumination angle, and birefringence. Techniques for adjusting optical properties at specific locations on a reticle using an optical beam may be practiced for other purposes besides widening the process window.

In one embodiment, a method of widening a process window of a reticle that is used to fabricate a layer on a semiconductor wafer is disclosed. A map indicating a plurality of optical property adjustments at a plurality of locations on a reticle is provided. An optical property of the reticle is adjusted at each of the plurality of locations based the optical property adjustments of the provided map. The adjustment is accomplished by using an optical beam, and the optical property adjustments serve to widen the process window of the reticle. In a specific implementation, the optical beam is a femto-second laser.

In specific example embodiments, the optical property is selected from the following: dose level, illumination angle, phase, birefringence, and film property. In one aspect, the adjusting an optical property of the reticle at each of the plurality of locations substantially causes different illumination angles at different locations of the reticle. In a further aspect a first location is embedded with a first array of scattering elements and a second location is embedded with a second array of scattering elements, and the first array has different spacing than the second array so that the first location causes a different illumination angle than the second location. In another aspect, the adjusting an optical property of the reticle at each of the plurality of locations substantially minimizes critical dimension (CD) error of a semiconductor wafer produced with such adjusted reticle. In a specific example, the CD error includes overlay error. In yet another embodiment, the adjusting an optical property of the reticle at each of the plurality of locations substantially minimizes birefringence caused by the reticle, and the reticle's transparent material is modified along one axis in a different way than along an orthogonal axis to minimize birefringence. In a further aspect, a femto-second laser is used to embed scattering centers that have a different configuration in these two different directions.

In another embodiment, the optical property is a film property of the reticle's pattern and the operation of adjusting an optical property of the reticle at each of the plurality of locations is accomplished by directing the optical beam at an interface between a film on the reticle and a transparent portion of the reticle. In one aspect, the film property is changed for the reticle's entire film. In another aspect, the film property is changed only for specific locations of the reticle's entire film. In yet another embodiment, a femtosecond laser is directed at a side of the reticle on which the film is disposed. In yet another implementation, a femtosecond laser is directed at a side of the reticle that is opposite as side on which the film is disposed. In one embodiment, the operation of adjusting an optical property of the reticle at each of the plurality of locations is accomplished so as to adjust a critical feature on a wafer fabricated with such reticle.

In one implementation, the optical properties of the reticle at each of the plurality of locations are adjusted prior to patterning the reticle. In yet another embodiment, the map indicating a plurality of optical property adjustments is obtained from a reticle inspection results. In another implementation, the map is obtained from a wafer inspection results. In yet another embodiment, the map is obtained from predictive modeling results. Alternatively, the map is obtained from both predictive modeling results and inspection results.

Embodiments of the present invention allow one to adjust optical properties of a reticle using an optical beam, thus, providing significant flexibility for correcting errors produced by the reticle or simply optimizing the reticle's properties. Embodiments for widening the process window of the reticle by locally or globally changing optical properties on the reticle allow more deviations in the lithography process to occur without causing harm to the printed wafer.

These and other features and advantages of the present invention will be presented in more detail in the following specification of the invention and the accompanying figures which illustrate by way of example the principles of the invention.

DETAILED DESCRIPTION OF SPECIFIC EMBODIMENTS

Figure 1:
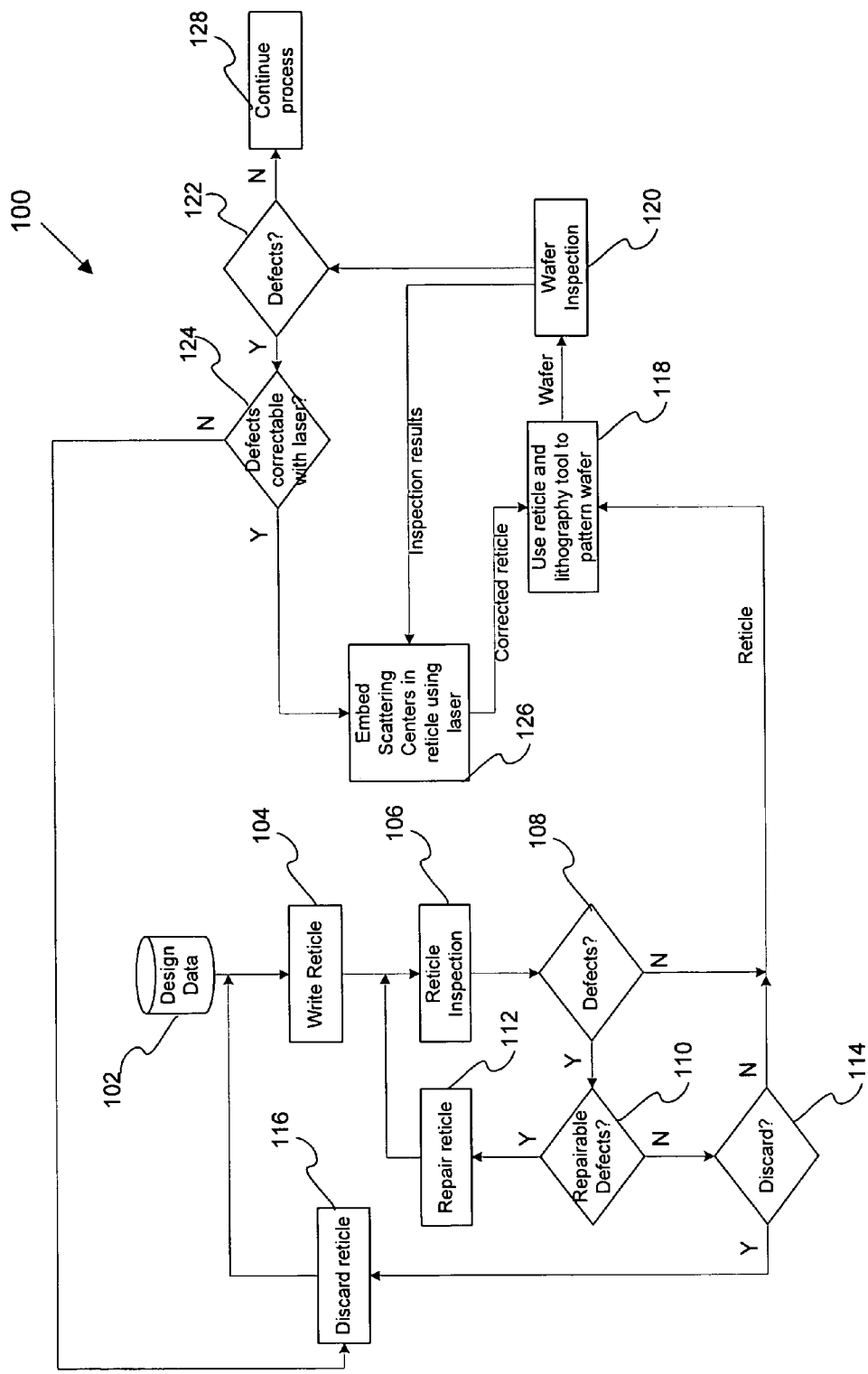
FIG. 1 is a flowchart illustrating an integrated circuit (IC) device design process in which a laser may be utilized to change the optical properties of a reticle in accordance with various embodiments of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

A "reticle" or a "mask" is generally defined as a substantially transparent substrate having substantially opaque (or partially transmitting) regions formed thereon and configured in a pattern. The substrate may include, for example, a glass material such as quartz. The substantially opaque regions may be formed of a material such as chromium. A reticle may be disposed above a resist-covered wafer during an exposure step of a lithography process such that the pattern on the reticle may be transferred to the resist. For example, substantially opaque regions of the reticle may protect underlying regions of the resist from exposure to an energy source. Many different types of reticles are known in the art, and the term reticle as used herein is intended to encompass all types of reticles.

The present invention generally includes techniques for using an optical beam, such as a laser, on a reticle to correct or change one or more optical properties, such as a transmission level, at one or more specific locations in the reticle. One such reticle correction apparatus is further described in International Application having Application No. PCT/IL2004/000653, filed 18 Jul. 2004, and in U.S. Provisional Application No. 60/488,717, filed 18 Jul. 2003, which applications are incorporated by reference in their entirety.

In one example, CD variation is corrected by using a laser to form "scattering centers" (SC's) that are embedded within the reticle to obtain varying amounts of light transmission or dose through the reticle. The SC's are specific volumes of damage that are created with the laser at various positions embedded within the reticle to thereby alter the transmission levels through the reticle at particular locations of the reticle. An increase in the number of SC's created in a given location results in a reduction in dose through such location in the reticle, as compared with another location with fewer SC's. These SC's may be formed in the interior transparent portion of the reticle, as opposed to the pattern portion of the reticle. Thus, one location of the reticle can have a different dose than another location on the reticle as a result of specific SC placement by the laser. In this application of the laser, the resulting dose variation of the reticle is selected to cause a more uniform distribution of CD across the resulting wafer.

Introduction

FIG. 1 is a flowchart illustrating an integrated circuit (IC) device design process 100 in which a laser may be utilized to change the optical properties (e.g., reduce CD variation) of a reticle in accordance with various embodiments of the present invention. To provide a simplified introduction to basic concepts of the present invention, the following process 100 will initially be described in the context of using a laser only to correct CD variation that is indicated by a wafer inspection. Later described embodiments include various alternative applications of such laser to correct or change numerous types of optical properties, including dose variation, at various stages of the design process. This initial introduction is merely illustrative and is not meant to limit the scope of the invention.

Initially, design data is received at operation 102. Design data may include any portion of an IC design for implementation in the IC device. The IC design can be developed using any number of suitable design techniques. For example, a designer may create the IC design by using preexisting schematic library blocks from various electronic design automation (EDA) tools. In some cases, the designer may create the IC design or part of the IC design from scratch with the aid of any suitable design system, such as conventional computer aided design (CAD) tools. For example, the designer may use a schematic CAD tool to plan the logic diagrams for a particular IC design. Still further, the designer may write a description of the IC design or portions of the IC design with the aid of a hardware design language, such as VHDL.

The IC design is generally converted into design data that is in a suitable format that allows a pattern corresponding to the IC design to be produced onto a reticle. For instance, design data may be in a GDSII format. Design data may also be in a format of a database, such as a circuit layout pattern database that is generated from the IC design using any suitable tool, for example, by using EDA or CAD tools. The circuit layout pattern database is composed of a plurality of electronic representations of layout patterns for IC layers that are converted into a plurality of reticles that are used to fabricate a plurality of physical layers of an IC device. Each physical layer of the fabricated IC device corresponds to one of the reticles and an associated one of the electronic representations of the circuit pattern database. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. Each electronic representation is composed of a plurality of polygons or other shapes, which together define the reticle pattern.

After the design data is received, the design data is used to write a reticle in operation 104. The reticle may be written using any suitable pattern generator or reticle writer equipment, such as as a vector scan E-beam tool model EBM-4500, which is commercially available from Nuflare Technology Inc., Japan. The reticle corresponds to one or more electronic representation(s) from the design data. The reticle is then inspected in operation 106, and it is determined whether the reticle has any defects in operation 108. Any method or technique may be used for reticle inspection. One such reticle inspection technique is described in U.S. patent application Ser. No. 09/679,617, entitled "METHODS AND SYSTEMS FOR INSPECTING RETICLES USING AERIAL IMAGING AND DIE-TO-DATABASE DETECTION", filed 6 Oct. 2003 by Stan Stokowski et al, which application is herein incorporated by reference in its entirety for all purposes. Defects are defined herein as any discrepancy on the reticle or wafer, including missing material, extraneous material, variations in critical dimension (CD) across the reticle, etc. That is, a defect is generally any characteristic of the reticle or wafer that fails to meet an expected or ideal requirement.

If the reticle has no defects, the reticle is used along with one or more lithography tools (e.g., scanner, stepper, etc.) to pattern the wafer (e.g., the reticle is used to fabricate a physical layer of the IC device by transferring the reticle pattern onto a photoresist covering the wafer and then etch such pattern onto an underlying device layer of the wafer) in operation 118. However, if the reticle has a defect, a determination is made as to whether the defect is repairable in operation 110. A repairable defect may be defined according to any suitable guideline or specification. For instance, localized defects (e.g., extra pattern material on the reticle; missing pattern material on the reticle) in the reticle pattern can be deemed repairable. In some embodiments, the repairable defects are confined to a substantially limited area of the reticle pattern.

If the defect is repairable, the repairs are made in operation 112 and the repaired reticle is then inspected again in operation 106. If the defect is not repairable, it is then determined whether the reticle should be discarded in operation 114. In certain cases, even when the reticle defects are not eliminated (or repaired) in the reticle pattern itself, the reticle may still be usable as further described below. If the reticle is not usable, then the reticle is discarded in operation 116 and another and hopefully, non-defective reticle is written in operation 104. For instance, changes may be made to the design data or the reticle writing process may be adjusted in order to produce a non-defective reticle. If the determination in operation 114 is negative, then the reticle that was inspected can then be used along with any suitable type of lithography tool to pattern the wafer in operation 118.

After the wafer has been patterned with a lithography tool in operation 118, the wafer may then be inspected in operation 120. Any conventionally available wafer inspection technique or mechanism can be used for inspecting the wafer. Next, a determination as to whether the wafer includes any defects is performed in operation 122. If it is determined that no defects are present in the wafer, then the wafer is allowed to continue along the design process to fabricate the IC device(s) in operation 128. However, if it is determined that a defect is present in the wafer, it is then determined whether the defect is correctable with a laser in operation 124. For instance, a defect is correctable with a laser when it is determined that the wafer defect can be mitigated by a change to the effective light transmission through the reticle. Also, if it is determined that a defect is present, the wafer may be discarded.

If the defect is not correctable by use of a laser, operation 116 is repeated, where the reticle is discarded. However, if the defect is correctable, then the laser may be used to create scattering centers (SC's) in the reticle to change the light transmission properties through at specific locations on the reticle. The properties of the SC's (e.g., such as the density, size, and type) can be based on the inspection results (e.g., CD variation information) received from the wafer inspection 120. After creating the SC's in the reticle, the corrected reticle can now be used along with various lithography tools to pattern another wafer in operation 118.

It should be noted that the present invention can employ any suitable number and type of reticle and/or wafer inspection or defect review tools. For example, KLA 301, 351, or 353UV Reticle Inspection Tools, AIT-XP, eS20XP, TeraStar, and SL3UV inspection tools, or eV300 and CRS3100 review tools, commercially available from KLA-Tencor of San Jose, Calif., may be employed. Each inspection tool may take the form of an optical system, such as a bright field or dark field optical system. The station may also utilize both bright field and dark field modes. Examples of bright field systems include the 2350, 2351, 2360, and 2370 from KLA-Tencor, Corp. of San Jose, Calif. Examples of dark field system include the AIT II, AIT XP, Fusion, Fusion UV, and SP1 PatternPro available from KLA-Tencor, Corp. of San Jose, Calif. Each tool may also take the form of an electron beam (ebeam) system, such as a scanning, snapshot, or step-and-repeat type ebeam system. A station may be designed to detect special types of defects, such as macro defects across a large area of the sample, defects on a bare substrate, or defects within solder bumps (e.g., ball grid array bumps). Each inspection tool may be a stand alone device or integrated within a processing or lithography tool. Additionally, the laser correction tool (e.g., used to embed SC's in the reticle in operation 126) may be a separate device or integrated within any inspection, processing, or lithography tool.

Figure 2A:
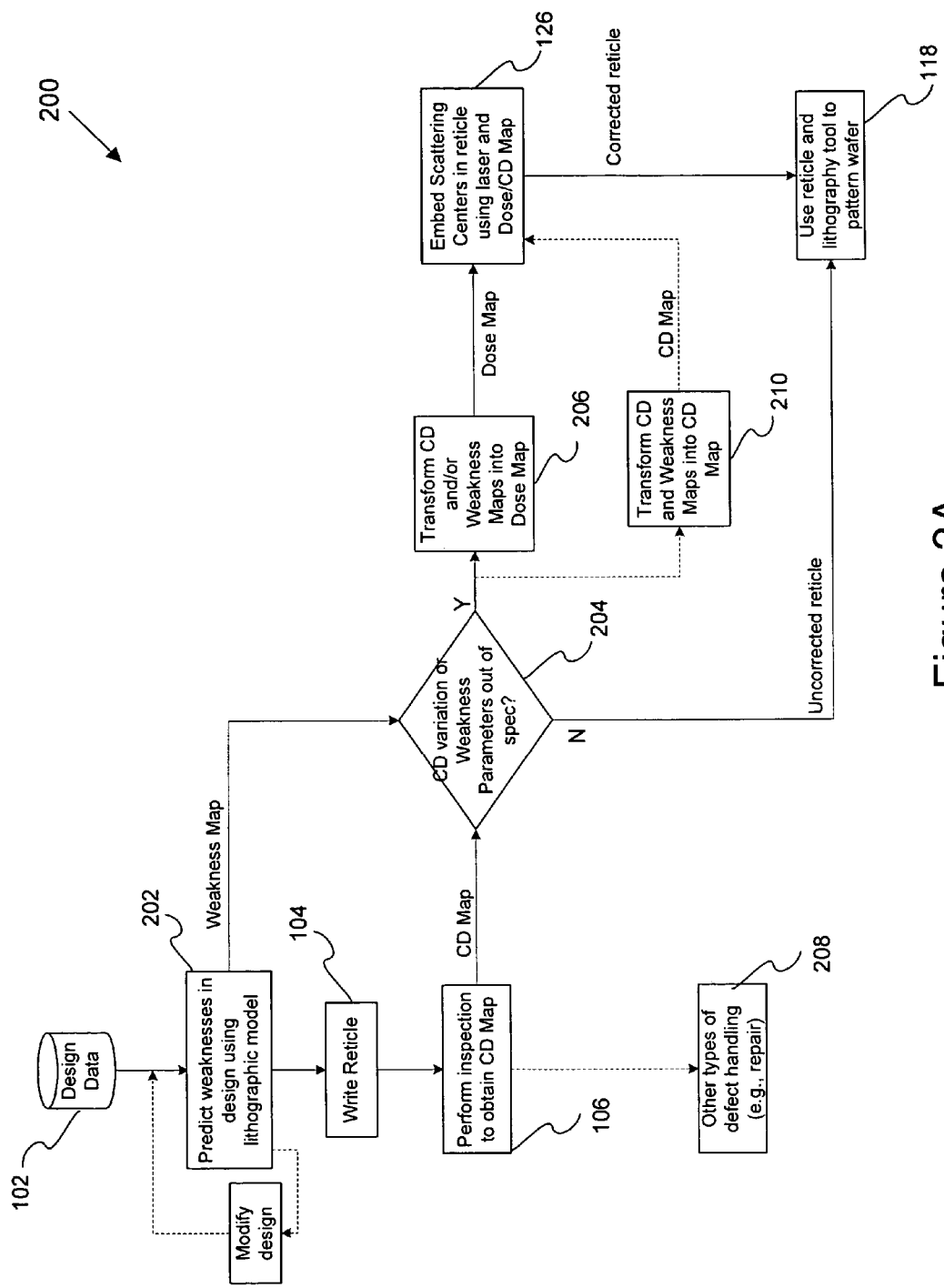
FIG. 2A is a flowchart illustrating a procedure for modifying the reticle based on design weaknesses that are predicted from the design data in accordance with one embodiment of the present invention.

Techniques for Minimizing Parameter Variations in the Patterned Wafer Using One or More Prediction Models One or more models for simulating processes for forming the patterned reticle and/or wafer may be advantageously used to modify a reticle to correct parameter variations in a resulting patterned wafer. The modeling techniques described herein may be utilized early in the design process prior to forming a patterned wafer or later in the design process after inspection of a patterned wafer. FIG. 2A is a flowchart illustrating a procedure 200 for modifying the reticle based on design weaknesses that are predicted from the design data in accordance with one embodiment of the present invention. Some of the operations of FIG. 2A can be implemented in a same manner as similarly labeled operations of FIG. 1. Initially, design data is received at operation 102. Design data may include the circuit layout pattern along with any corresponding modifications (e.g., optical proximity correction—OPC). At operation 202, one or more model(s) are used to predict weaknesses in the design. Generally, weaknesses include any defects or potential defects that are predicted to be present on a patterned reticle and/or patterned wafer that is fabricated with the design data under specific processing conditions. Weaknesses include any problem in a patterned wafer which may, for example, produce a non-functional IC device. Examples of predicted weaknesses include the bridging (e.g., short circuit) of adjacent line structures when no bridging is intended or the breaking (e.g., open circuit) of line structures when no breaking is intended.

Any technique or mechanism may be used to facilitate the prediction of weaknesses in the design. For instance, a reticle writing model and a lithographic model may be used to simulate a patterned wafer based on the received design data and identify areas of weaknesses in the simulated pattered wafer. The complexity of the models depends on the number and type of process parameters and patterned wafer characteristics that are correlated by the models. For example, the reticle fabrication and lithographic models can be generated based on the following process parameters: optical tool parameters (e.g., illumination settings parameters, aperture settings, aberration terms, etc.) of both the reticle writer tool and the lithography tool, reticle characteristics such as type and material composition, resist chemistry characteristics, and post-lithography processing characteristics. Various modeling techniques are described further below.

The predicted weaknesses may be identified or presented using any suitable format. For example, the model(s) can output a defect map or weakness map to identify the weaknesses at specific locations (e.g., via coordinates) in the simulated reticle or wafer pattern. Once the weaknesses are predicted in operation 202, various corrective measures may be implemented to address the weaknesses as explained further below. In some instances, the design is modified to minimize or eliminate some or all of the weaknesses. In other instances, the reticle is modified (after it is fabricated) to minimize or eliminate some or all of the weaknesses.

At operation 104, the reticle is written with a pattern based on the original design data or the modified design data. Afterwards, the patterned reticle is inspected at operation 106 and may proceed to perform other types of defect handling operations (e.g., repair) in operation 208. Any conventional reticle inspection tool or technique may be used to inspect the patterned reticle. The reticle inspection tool may also generate a mapping of measured variance values associated with the patterned reticle. For instance, a CD map may be generated.

It is then determined whether the CD variation produced by the reticle inspection and/or the weaknesses (if any) identified by the prediction model(s) are out of specification in operation 204. In most cases, identified weaknesses such as opens or shorts are inherently out of specification. Likewise, if no weaknesses are identified or predicted, then it is determined that the design weaknesses are not out of specification. Any tolerance level (e.g., ±10% from specification) may be prescribed to determine whether the CD variation or the weakness parameters are out of specification. If the CD variation or identified weaknesses are not out of specification, the uncorrected reticle is used along with lithography tools to pattern the wafer in operation 118.

If either the CD variance or identified weaknesses are determined to be out of specification, then the CD variance and/or weakness maps are transformed into a suitable format for changing the optical properties of the reticle. For instance, the CD and/or weakness maps are transformed into a dose map in operation 206. Alternatively, the CD variance and weakness maps may be transformed into a consolidated CD map in operation 210. Scattering centers are then embedded in the reticle based on the final dose or CD map using the laser (or any other suitable reticle correction tool) in operation 126. Thereafter, the corrected reticle may be used along with lithography tools to pattern the wafer in operation 118.

Weaknesses in the patterned reticle or wafer may be predicted in any suitable manner based on the design data. In general, the design data is input to one or more models that are configured to predict how the design data patterns will print onto the reticle and/or wafer. Several techniques for predicting weakness parameters using design data are further described in U.S. patent application Ser. No. 11/048, 630, entitled "COMPUTER-IMPLEMENTED METHODS FOR DETECTING DEFECTS IN RETICLE DESIGN DATA", filed 31 Jan. 2005 by Zain K. Saidin et al, which application is herein incorporated by reference in its entirety for all purposes.

Figure 2B:
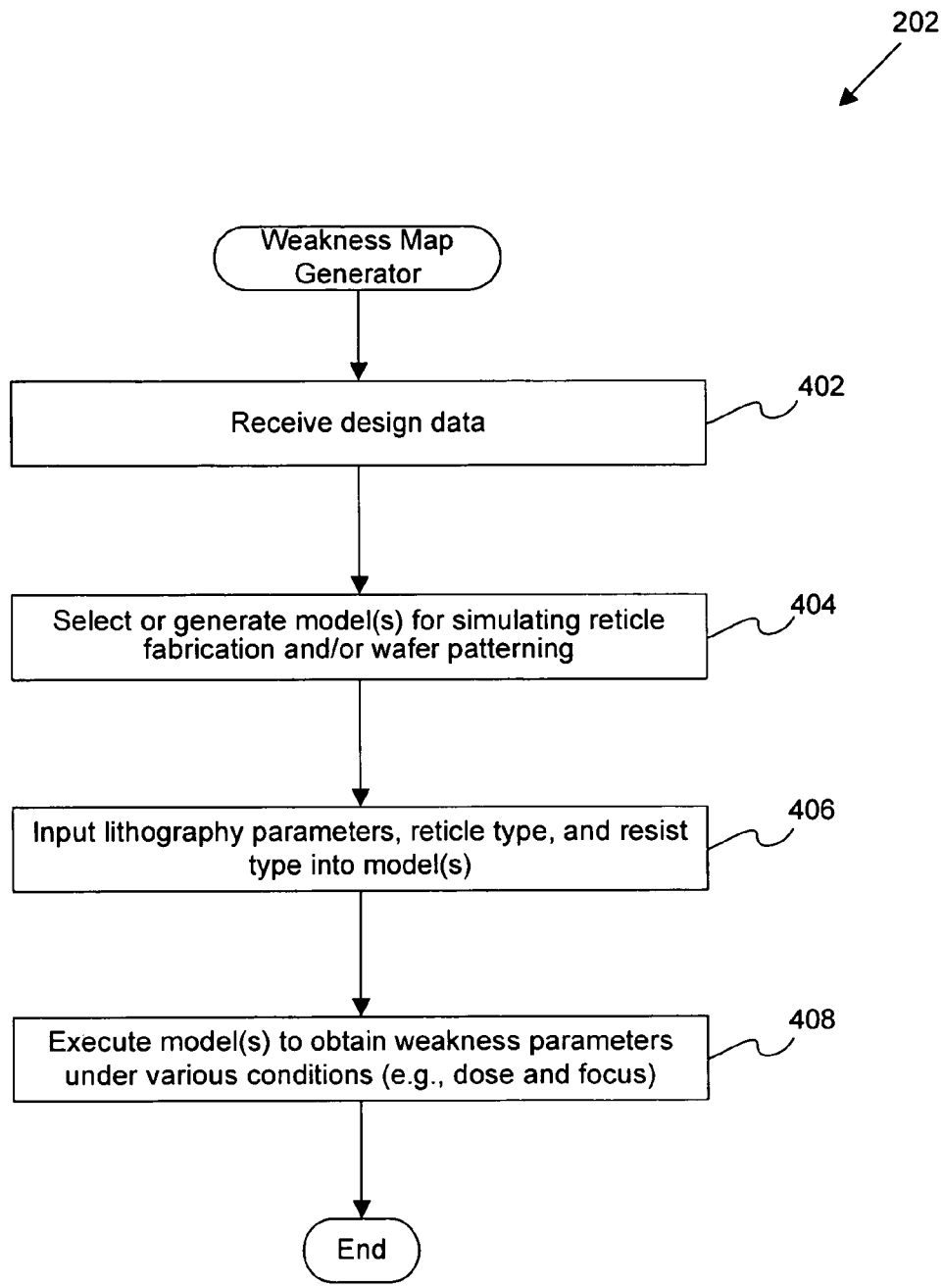
FIG. 2B is a flowchart illustrating the operation of FIG. 2A of predicting weaknesses in the design in accordance with one embodiment of the present invention.

FIG. 2B is a flowchart illustrating the operation 202 of FIG. 2A for predicting weaknesses in the design in accordance with one embodiment of the present invention. Initially, design data is received in operation 402. This design data may be generated any number of ways as described above. One or more models for simulation reticle writing and/or wafer patterning are then selected or generated in operation 404. The model may also include simulating one or more processes that are performed on the wafer after the resist is exposed. Lithography parameters, reticle characteristics, and resist chemistry characteristics are then input into the model(s) in operation 406. The model(s) are then executed to obtain weakness parameters under various conditions, such as dose and focus, in operation 408. The procedure 202 for predicting weakness parameters then ends.

In general, a model for predicting weakness parameters may be generated by printing a plurality of wafers having different noteworthy structures under various conditions. Specific features of the wafers are then inspected and analyzed to form models that correlate changes in conditions to changes in structure characteristics. In one embodiment, the presence of shorts or opens in certain structures is monitored under various conditions and model algorithms are setup to mimic the actual results. By way of examples, the conditions could include the light source wavelength of the reticle writer and lithography tool, the optical conditions of the reticle writer and lithography tool (e.g., aberration parameters and aperture settings), the specific reticle properties, and specific resist properties. The conditions could also include various post-lithography processing parameters, such as deposition composition, temperature, and rate, etching material and rate, or any suitable chemistry and physic parameters of the process.

Figure 2C:
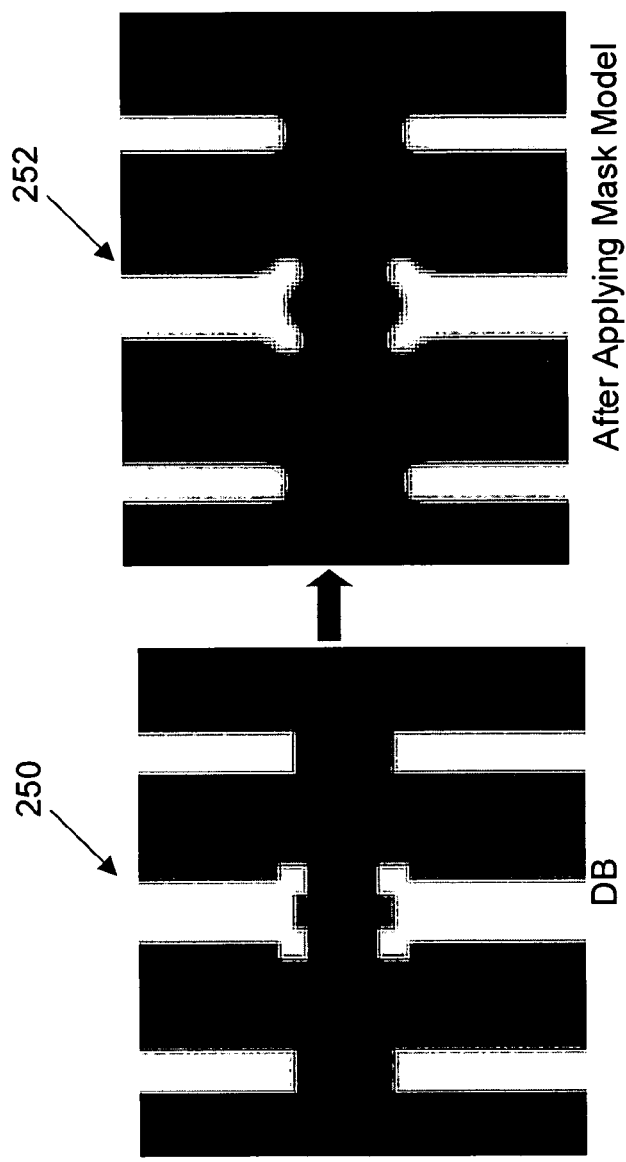
FIG. 2C illustrates a top view of design structures that are input into a mask model to produce a simulated mask image.

FIG. 2C illustrates a top view of design structures 250 that are input into a mask model to produce a simulated mask image 252. A mask model is used to predict changes that occur to the design structures when they are used to write a reticle. For example, corners of the design structures 250 are changed into mask structures 252 that have more rounded corners. A lithography tool model for simulating how the wafer patterns will be printed using the simulated mask pattern 252 may then be applied. For example, the lithography tool model may predict that the printed wafer structures will have corners (not shown) that are more rounded then the mask structures.

In one embodiment, the simulated wafer patterns or images may then be inspected utilizing any conventional inspection procedure, such as die-to-die or die-to-database, etc. For instance, a reference image of the wafer may be generated under ideal conditions or obtained from a "golden wafer" that has already passed inspection. Portions of the reference image are compared to like-portions of the simulated wafer image. Significant differences (e.g., differences above a predetermined threshold) between the reference and simulated portions are then flagged as defects. These defects may then be presented as predicted weaknesses of the design data.

Figure 2D:
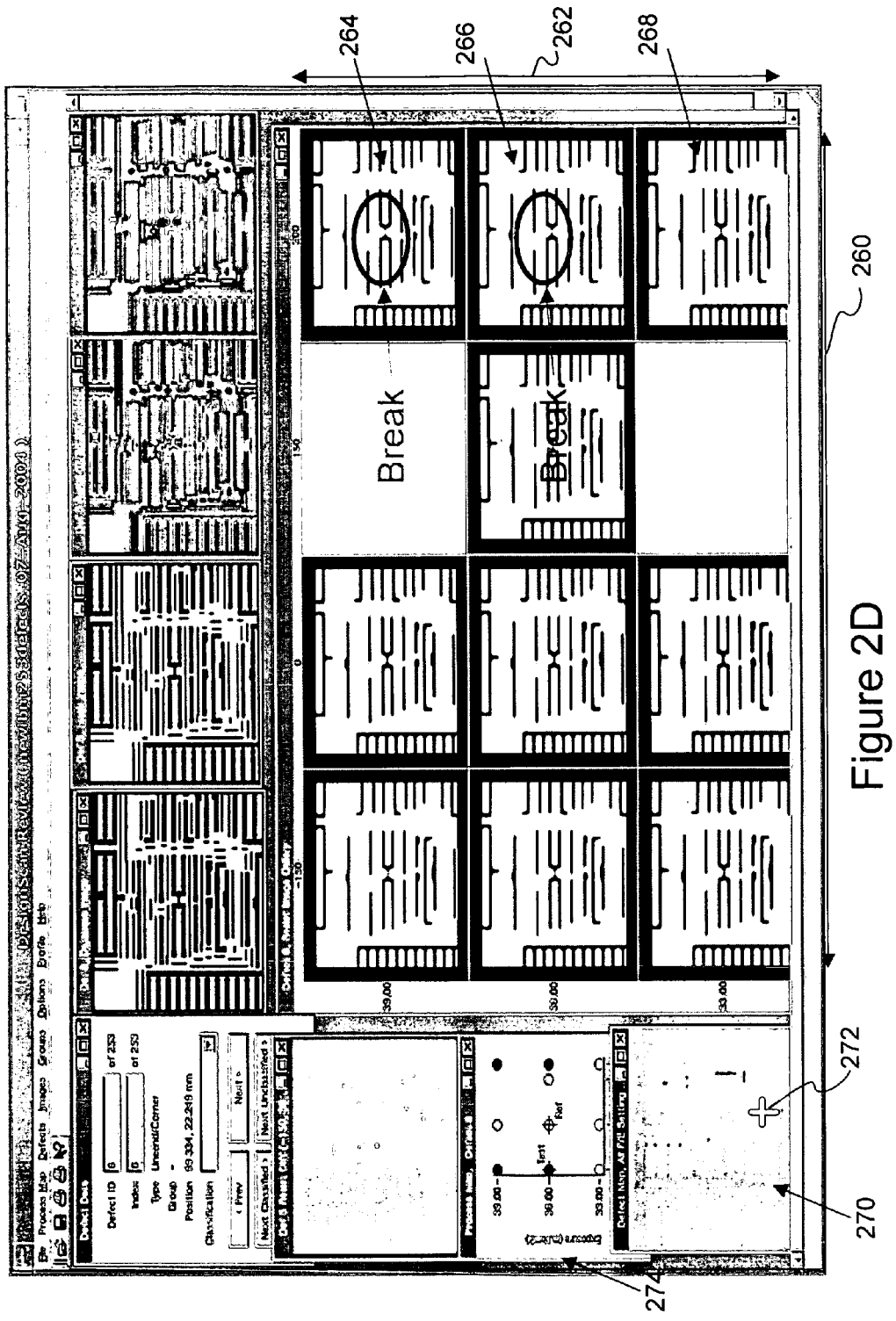
FIG. 2D is a screen shot illustrating an example of prediction output from a lithographic model in accordance with a specific implementation of the present invention.

The weaknesses produced by the model(s) may take any suitable form. FIG. 2D is a screen shot illustrating an example of prediction output from a lithographic model in accordance with a specific implementation of the present invention. As shown, a defect map 270 is presented. The defect map 270 generally highlights defects, such as shorts, partial opens, or opens, at specific locations on the simulated wafer. A user may then select a particular defect, such as defect 272, for analysis. A weakness summary map 274 may then be presented. This weakness summary map 274 may summarize the specific conditions that result in the weakness and other conditions that result in the absence of such weakness. As shown, the weakness summary map 274 shows points that are either shaded dark or light at different combinations of exposure/dose and focus. The dark points represent weaknesses or defects, while the lighter points indicate the absence of such weakness/defect at different dose and focus combinations. Weakness images may also be presented at the different dose and focus combinations. For example, the images may be arranged in a grid pattern, where each column 262 has a same focus and each row 260 has a same dose. As shown, area 272 of the simulated wafer has a short type defect in image 264 which corresponds to a focus of 200 and a dose of 39.00 and in image 266 which corresponds to a focus of 200 and a dose of 36.00.

The weakness images or weakness summary maps may be analyzed either manually or automatically to then determine an appropriate dose for each potentially weak area of the reticle so that the weakness are substantially eliminated. For instance, the weakness image 268 of FIG. 2D shows that the weakness will likely not occur if a dose of 33.00 is used for area 272 of the reticle. This methodology may be used for all the identified weaknesses to obtain a dose map that can be used to then embed scattering centers in the reticle using a laser (e.g., in operation 126) so as to reduce or eliminate the occurrence of weaknesses on the printed wafer. The variation results (e.g., CD variation) produced from a reticle inspection may also be used to then produce a dose map that is used to correct the reticle to thereby compensate for such variations. Additionally, known tool weaknesses, such as bright spots, may also be taken into account to obtain a more even light distribution through the reticle.

In the illustrated embodiment, the dose map is readily obtained from the model results since dose values that result in weaknesses and dose values that result in no weaknesses for each area of a simulated patterned wafer are available. However, if a model is used that merely presents a CD variation map, one may perform a reverse modeling algorithm to obtain a corresponding dose variation map.

Embodiments of this technique can also allow one to, in effect, achieve a wider process window for the reticle. That is, the lithography tool's dose may be selected in conjunction with reducing the effective dose through various locations or areas of the reticle by embedding SC's to thereby conform to the process windows of the various areas of the wafer. Additionally, defective wafers are less likely to be fabricated since the weaknesses were predicted and corrected early in the process. Thus, the time and expense typically required to alter the design and/or write a new reticle after a defective wafer is found is eliminated.

Figure 3A:
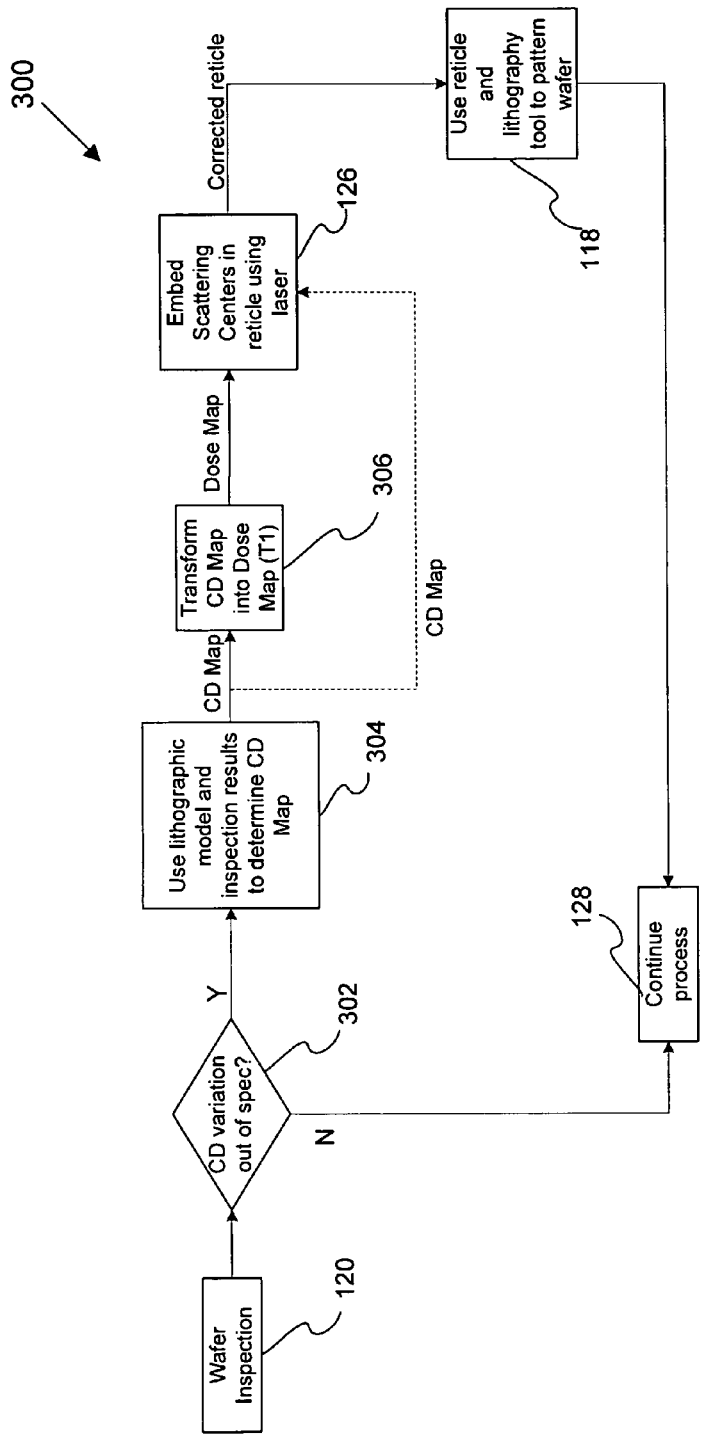
FIG. 3A is a flowchart illustrating an IC device design process in accordance with another embodiment of the present invention.

FIG. 3A is a flowchart illustrating an integrated circuit (IC) device design process 300 in accordance with another embodiment of the present invention. At operation 120, wafer inspection is conducted. As mentioned earlier, any wafer inspection tool or technique may be implemented. Next, it is determined whether the CD variation is out of specification in operation 302. Any tolerance level (e.g., ±10% from specification) may be prescribed to determine whether the CD variation is out of specification. If the determination operation of 302 is negative, then the IC design process continues in operation 128. If the determination operation of 302 is affirmative, then the inspection results are used in conjunction with a lithographic model to determine a CD map in operation 304.

The CD map may be used directly to embed scattering centers in the reticle using the laser in operation 126. However, the CD map may also be used indirectly to embed scattering centers in the reticle using the laser in operation 126. For instance, the CD map may be transformed into a dose map in operation 306 where the dose map is used directly to embed scattering centers in the reticle using the laser in operation 126. After the reticle is corrected with the embeded scattering centers, the corrected reticle may be used along with lithography tools to pattern the wafer in operation 118. Afterwards, the IC design process continues in operation 128.

A lithographic model may be used in conjunction with the inspection results to more intelligently generate a CD variation map or dose map. Several techniques for predicting weakness parameters using design data are further described in the above referenced U.S. patent application Ser. No. 11/048,630, which application is herein incorporated by reference in its entirety for all purposes. In general, lithographic models may be used to predict how different process parameters affect the CD parameter and then use this information to determine the desired CD or dose variation.

Figure 3B:
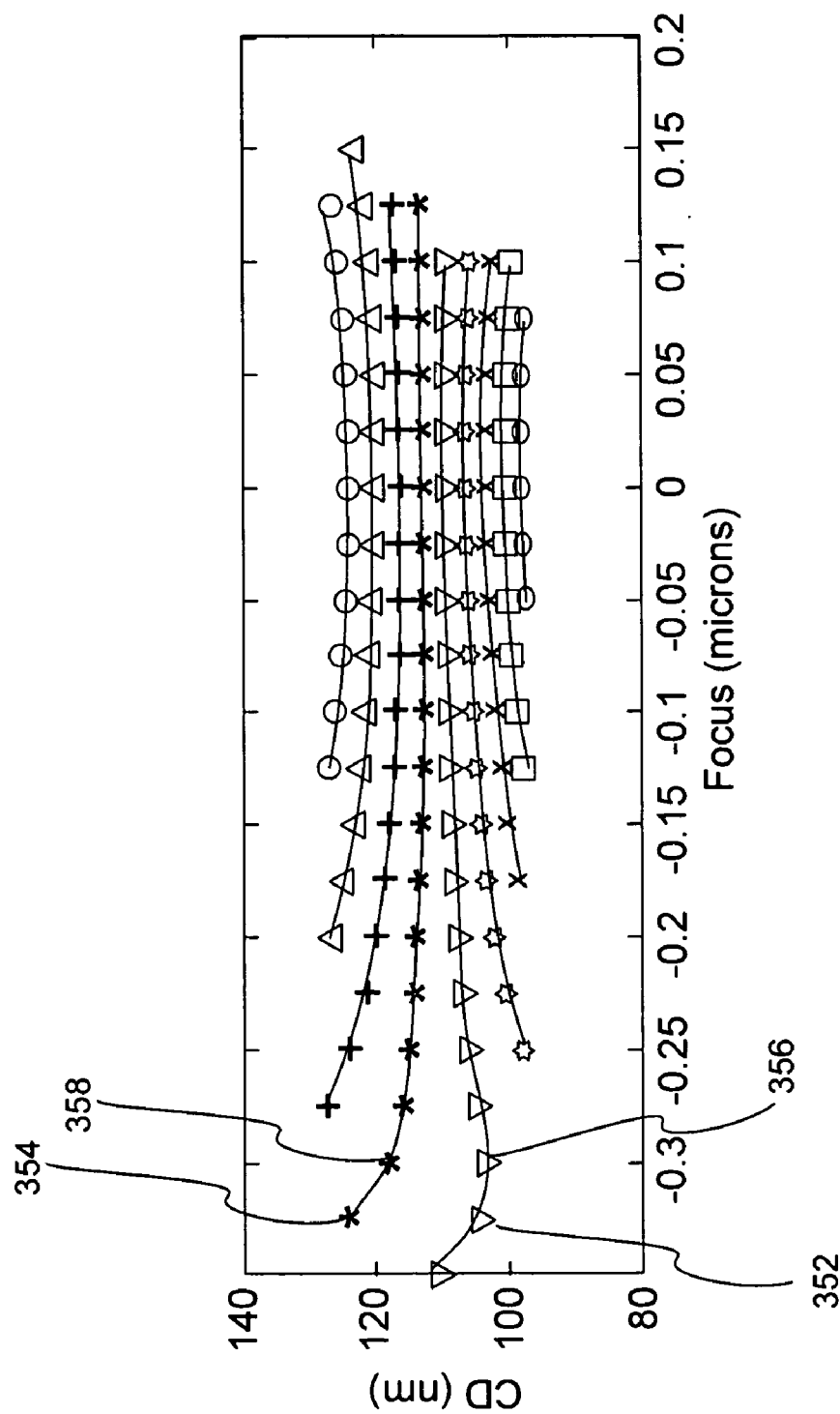
FIG. 3B is a graph illustrating CD values as a function of focus.

FIG. 3B is a graph illustrating CD values as a function of focus. This graph may also be used to illustrate the results of a model for a particular structure on a reticle. Each line of the graph has a different associated dose. If one wishes to change the CD of the structure represented in FIG. 3B, one could factor in the different relationships between focus, dose and CD as presented in FIG. 3B (as produced by a model). For example, a change in dose from point 352 to point 354 results in a larger CD than a change in dose from point 356 to point 358. That is, the dose change at a lower focus (about −3.3) results in a greater increase in CD than a dose change at a higher focus (about −0.3). In sum, conversion of a desired CD change to dose is not necessarily a linear function. A particular CD change may be translated into different dose changes depending on other operating conditions, such as focus and structure type. Such dependencies can be considered by utilizing a lithographic model in conjunction with the desired CD changes as determined from the wafer inspection results.

The modeling methods described herein can be used to detect and correct defects in reticle design data for binary mask (chrome on glass (COG) masks) or masks with any of a number of RETs such as OPC, phase-shifting masks (alternate aperture or embedded PSM (EPSM)), sub-resolution assist features (SRAFs) such as scattering bars, serifs, and hammerheads, chrome-less phase shift masks (CPL), and gray scaled images. The modeling methods can also be applied to complementary masks where the desired pattern is decomposed into multiple patterns, which are each imaged under different illumination conditions. For a complementary mask, the modeling methods include generating simulated images, each illustrating how the different, multiple patterns will be printed separately on a wafer by the different reticles. The modeling method may then use each of the simulated images in combination to generate additional simulated images (test images) that illustrate how the final reticle design pattern will be printed on a wafer using a multiple exposure wafer printing process on the scanner.

The modeling methods are equally applicable to optical lithography processes using visible, ultraviolet, and deep ultraviolet illumination (e.g., 248 nm, 193 nm, and 157 nm light sources), electron beam lithography, or extreme ultraviolet lithography using reflective masks and exposure wavelength near 13 nm. The modeling methods may also be applied to maskless lithography systems where reticle inspection is not possible. In this case, the modeling inspection has the added advantage of minimizing the need for difficult die-to-database inspection at the wafer level.

The modeling methods can be used for detecting and correcting process window marginalities in the reticle design data prior to manufacturing the masks and printing wafers. As such, the reticle design data inspection methods described herein are substantially less expensive than currently available methods. In addition, the mask making process and the wafer pattern transfer process are simulated. Therefore, the modeling methods account for how the reticle design data will be altered by the reticle manufacturing process and the wafer printing process. For the designer, modeling offers the ability to test multiple variations of a design without buying multiple variations of expensive masks. The designer may, therefore, select the reticle design implementation or correction with the broadest process window to maximize device yield in production. Modeling also provides the ability to generate reticle inspection, wafer inspection, and CD metrology and process control methods having selective sensitivity (sample plans, process window centering, and maximizing the available process window for production). Furthermore, the modeling method results may be used for optimization of the circuit design (e.g., optimization of one or more characteristics of the circuit design such as timing, parasitic, other electrical parameters, or some combination thereof).

The wafer level simulation may include simulation of the aerial image reticle manufacturing process), resist process (wafer printing process), and etch process to determine the final physical pattern that would be formed on the wafer. Alternative methods include aerial image simulation only; aerial image simulation with an adjustable threshold model calibrated to emulate the real photoresist performance as a function of CD, pitch and local environment; and aerial image simulation with an adjustable threshold calibrated to emulate the pattern transfer after resist processing and etch as a function of CD, pitch, and local environment.

The simulation at the wafer level can include, therefore, not just the lithography (wafer printing) process, but the full pattern transfer process, including any, some combination, or all of the following: etch, polishing, film deposition or growth, and any other steps that affect the final structure and topography of the device. Lithography parameters for which simulated images may be generated at different values can also include degree of partial coherence, illumination mode, numerical aperture, lens aberration (e.g., Zernike coefficients), resist parameters (e.g., thickness, development rate model, lumped parameter model, Dill coefficients, and thermal diffusion coefficients) and/or film parameters (e.g., substrate reflectivity, thickness, anti-reflection coating properties, etc.).

The simulation at the wafer level can also include electrical simulation of device performance in addition to physical simulation of the patterned structures. The electrical performance of the device—either parametric properties of selected regions of the circuit (e.g., resistance, capacitance, transistor performance, etc.), performance of localized regions of the circuit (e.g., phase lock loop frequencies, timing, etc.), or the simulated performance of the full circuit as intended in the end use application—can be used as the pass/fail criteria for the design and/or to select critical regions for further inspection, metrology, and/or process control. The method may also include altering the reticle design data based on results of the modeling method. For instance, the reticle design data may be altered by altering RET feature data of the reticle design data.

The simulation of the reticle design data printed on a wafer can be performed using parameter of multiple, different reticle manufacturing processes, and the simulation of the wafer printing can be performed using parameters for multiple, different exposure tools, etch tools, or other processes. Examination of the reticle design data for different processes and tools may be valuable since each tool or process with have different aberrations that impact the pattern transfer in different ways. The modeling simulations can then be used to determine the optimum combination of design, optical enhancements (e.g, OPC, RET, etc.), mask making process, and wafer manufacturing process. The method may also include generating additional simulated images illustrating how the reticle design data will be printed on the reticle at different values of one or more parameters of the reticle manufacturing process. Further, the methods may include selecting the different values of the one or more parameters of the reticle manufacturing process that produce a minimum number of design pattern defects on the reticle.

The modeling concept and data linkages to reticle and wafer inspection, CD control, and design optimization can also be performed using printed wafers based on die-to-database inspection. Although performing such printed wafer inspection involves making a reticle and printing wafers, such modeling methods would still add value to the integrated circuit manufacturing process.

Techniques for Widening Process Window

Any of the mechanisms for determining a dose map described herein may also be used to broaden the process window of a particular reticle. For example, inspection results from a plurality of wafers or prediction results from a lithographic model may be used to individually decrease the illumination level or dose at specific locations of the reticle to thereby obtain a larger process window. Also, any suitable optical, besides dose, of the reticle may be modified by an optical beam, such as a femto-second laser, at specific locations on the reticle so as to widen the process window for such optical property. Examples of other optical properties include phase, illumination angle, and birefringence.

A lithography process comprises a set of parameters, such as illumination level or dose, lens focus, etc. Each parameter has an associated range, such that if the parameters are within their associated ranges, the resulting printed wafer will be within specification tolerances. The collection of lithography parameter values that are within their respective ranges is herein referred to as a "process window."

Considering each parameter as a dimension in the multi-dimensional space given by the lithography parameters, a process window can be visualized as a volume in the multi-dimensional parameter space. It is desirable to make a given process window as wide as possible, since this translates into an increase in the tolerance of the lithography process with respect to parameter variations while still printing a wafer that is within specification tolerances. However, the process window is generally a function of the locations on the lithography mask, and in some mask locations the process window is tighter than in other mask locations. In general, mask locations with tighter mask patterns have tighter tolerance windows.

In general, the overall process window for any particular mask is given by the intersection of the individual process windows of the various locations on the mask, with the mask generally divided into a finite number of locations which collectively make up the entire mask. Therefore, it is desirable to maximize the intersection (i.e. overlap) of the individual process windows. While this requirement is slightly relaxed in lithography settings where some process parameters such as illumination intensity and focus can be varied as a function of mask location, the available degree of such variation is generally limited, and therefore maximizing the intersection of process windows is desirable even in such lithography settings having the benefit of location-dependent parameter variation.

Figure 4B:
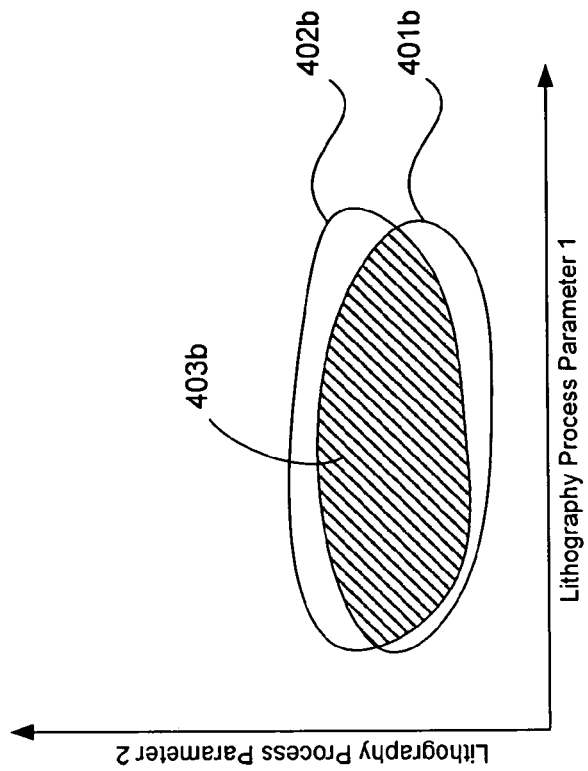
FIG. 4B illustrates the two locations on the reticle of FIG. 2A after the reticle has been modified.
Figure 4A:
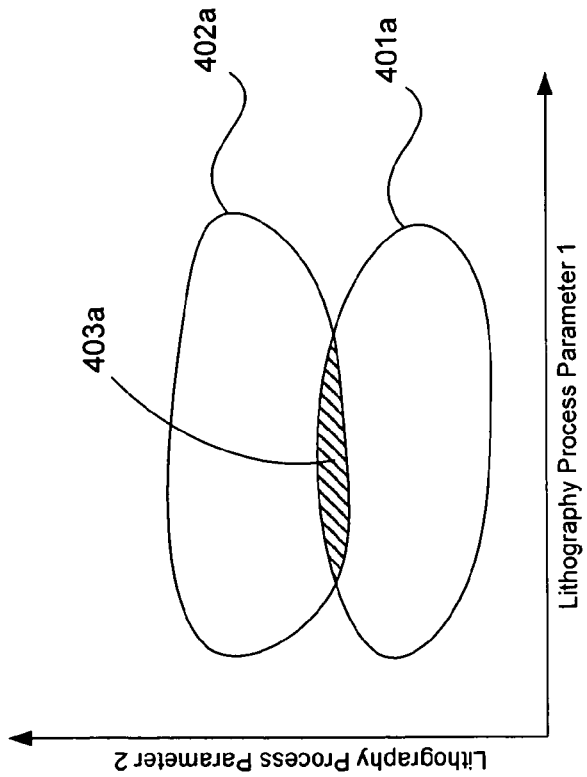
FIG. 4A illustrates two locations on a reticle having two associated process windows.

As an example, consider two particular locations on a lithography mask (for example two rectangular regions on the mask), with the two locations having two associated process windows 401a and 402a, as shown in the diagram of FIG. 4A. The current overlapping area 403a between the two process windows 401a and 402a is quite narrow. The reticle correction tool described herein may be usefully applied to modify the mask and move one or more of the process windows 401a and 402a in a way that results in an increase in the overlap between the two process windows. The result of one such example mask modification is illustrated in the diagram of FIG. 4B, showing an increase in the overlap 403b between the process window 401b (which has not moved as a result of the mask modification) and the process window 402b (which has moved as a result of the mask modification).

One particular way to achieve this type of mask modification is to use a short-burst laser to embed scattering centers within the mask's transparent material as described above. One particular implementation of this technique is described in the above referenced International Application having Application No. PCT/IL2004/000653 and U.S. Provisional Application No. 60/488,717). Embedding scattering centers in particular locations within the mask glass decreases the amount of illumination that is transmitted through the particular mask location onto the wafer. As a result, the range of acceptable illumination intensity through the particular location adjusts upward (i.e. towards higher intensities), since the scattering centers decrease the effective illumination intensity seen at the wafer.

Figure 5A:
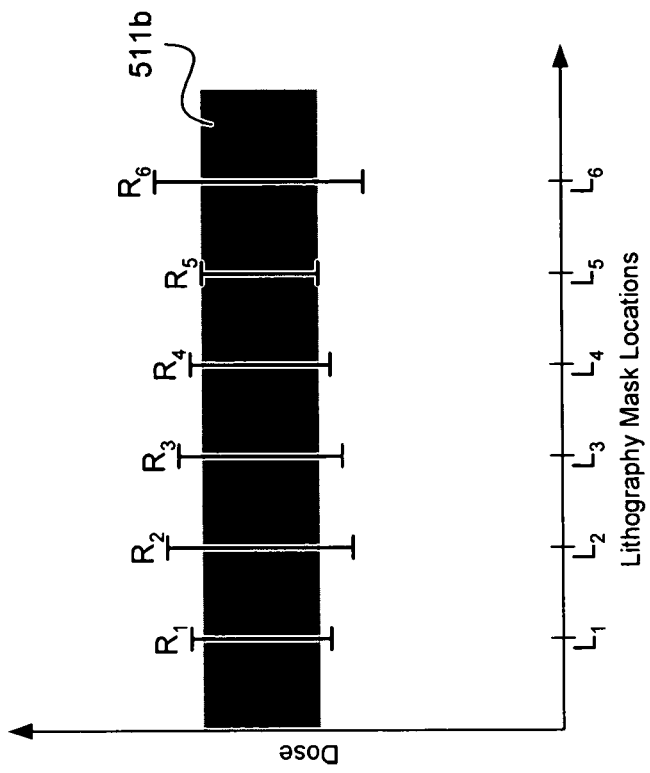
FIG. 5A illustrates example locations on a reticle having different associated dose ranges in accordance with one embodiment of the present invention.
Figure 5B:
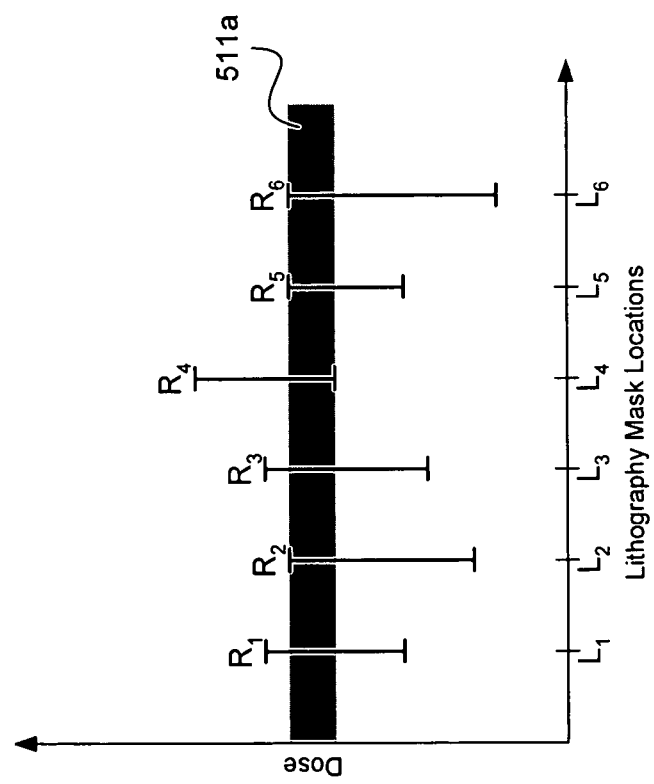
FIG. 5B illustrates example locations on a reticle having different associated dose ranges after adding scattering centers to selected locations in accordance with one embodiment of the present invention.

The range of acceptable illumination intensity for a particular mask location is referred to as the "dose" associated with that location, and the scattering centers in effect allow an upward adjustment in dose. As an illustrative example, consider a series of example locations $L_1, \ldots, L_6$ on a particular example lithography mask, with each location having an associated dose expressed as ranges $R_1, \ldots, R_6$ and producing an overall process window 511a, as shown in FIG. 5A. Embedding appropriate scattering centers into mask locations $L_1, L_2, L_3, L_5$ and $L_6$ raises their respective dose ranges $R_1, R_2, R_3, R_5$ and $R_6$ and aligns them, thereby increasing the intersection of the dose ranges $R_1, \ldots, R_6$ and widening the overall process window 511b as illustrated in FIG. 5B.

Techniques for Minimizing Optical Properties of Reticle

A reticle correction tool, such as a femto-second laser, (or any other suitable tool for producing an optical beam) may be used to alter any suitable optical property of the reticle (e.g., phase, illumination angle, birefringence, film property etc.), besides dose levels of the incident beam as it traverses through specific locations of the reticle. The reticle may be modified after or prior to patterning of the reticle and may be modified by transmitting the optical beam through either the illumination or patterning side. These modifications of the reticle's optical properties at specific locations may be based on reticle or wafer inspection results and/or predictive modeling results.

In one embodiment, birefringence is monitored across the reticle and the reticle is then corrected to minimize such birefringence. Birefringence is caused by anisotropic materials or by stress, such as reticles formed from glass, plastic, or fused silica. In general, birefringent materials refract an unpolarized incident beam into two separate, orthogonally polarized rays that take different paths, depending on orientation of the material with respect to the incident beam. The refracted rays can be said to have a component that is parallel to the intrinsic crystallographic axes of the material or to the uniaxial stress direction and a component that is perpendicular to the intrinsic crystallographic axes of the material or to the uniaxial stress direction. Thus, in theory the reticle material could be modified in one direction in a different way than the other orthogonal direction to minimize the birefringence effect.

Figure 6:
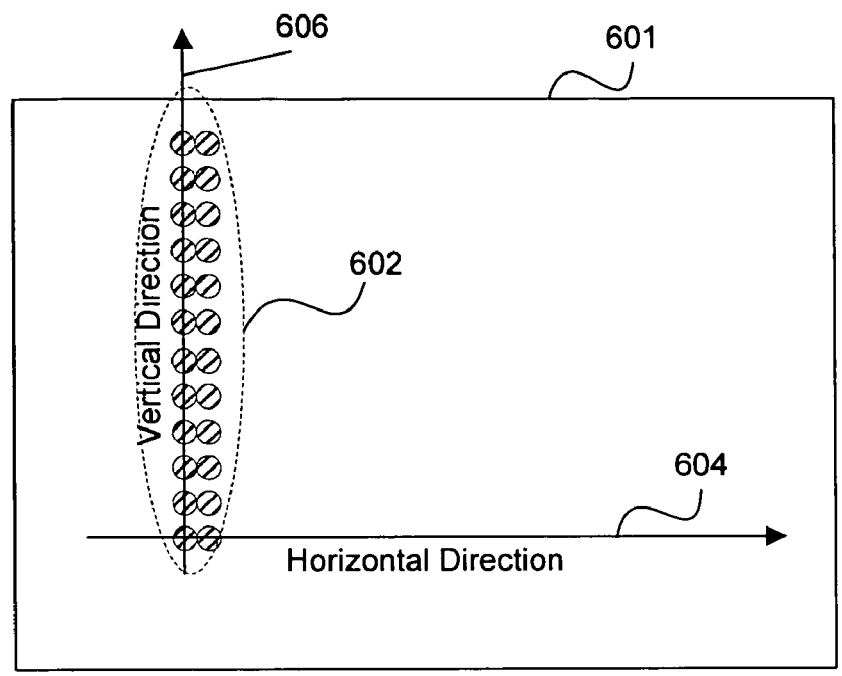
FIG. 6 illustrates modification of a reticle to control birefringence in accordance with one embodiment of the present invention.

FIG. 6 illustrates the modification of a reticle 601 to control birefringence in accordance with one embodiment of the present invention. As shown, scattering centers "SC's" 602 are added to the reticle 601. The SC's have a first configuration with respect to a first direction (designated as a horizontal direction) 604 and a second configuration with respect to a second direction (designated as a vertical direction) 606. For instance, the SC's in the vertical direction are spaced farther apart than the SC's in the horizontal direction. The horizontal direction 604 corresponds to one of the refacted beams, while the vertical direction 604 corresponds to the other refracted beam. The SC's are arranged so that they have a different effect on the refraction index in the two orthogonal directions so as to minimize birefringence.

Figure 7:
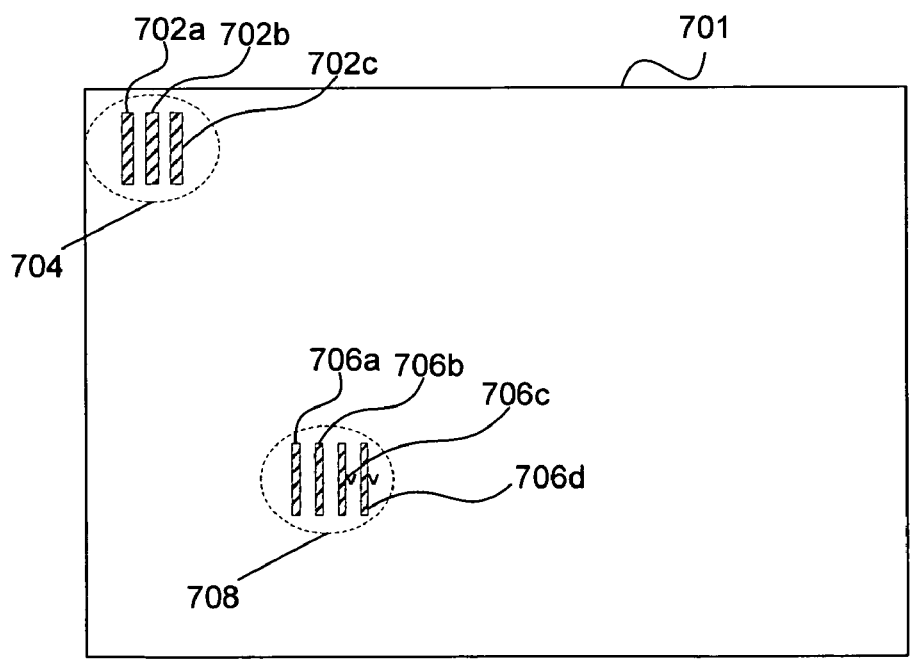
FIG. 7 is a diagrammatic top view representation of a reticle that is modified to result in different illumination angles.

In another application of the laser correction tool, the reticle may be modified to cause different illumination angles at different locations of the reticle. One possible advantage of using different illumination angles at different locations of the reticle is that the process windows for the lithography can overlap better. FIG. 7 is a diagrammatic top view representation of a reticle 701 that is modified to result in different illumination angles. As shown, the reticle 701 has been modified in two areas. A first area 704 has a first set of SC's 702 and a second area 708 has a second set of SC's 706. The first and second set of SC's are each in the form of an array of structures that have been formed by the laser. That is, each array structure is formed by damaging an array of segments of the reticle. These arrays are each designed to have spacing so as to redirect the illumination path of the incident beam via diffraction of various orders. The first SC's 702 have a different arrangement or spacing than the second SC's 706. Therefore, the first area 704 causes the incident beam to have a different illumination angle than the second area 708.

In yet another application of the laser correction tool, the reticle may be modified to cause incident light to have different phase at different locations of the reticle. Changing the phase at different locations on the reticle may achieve correction of overlay error on the patterned wafer. That is, a phase shift may result in moving an edge of a structure that may otherwise be shifted to cause an overlay error.

The reticle may also be modified to change the reticle pattern's film properties. For example, an optical beam, such as a femto-second laser, may be directed at the interface of the patterned film of the reticle either through the patterned side or through the illumination side of the reticle. The film properties may be changed locally or globally on the reticle. Several test runs may be performed at different laser settings at different positions with respect to the film on the reticle to determine the correct laser setting for producing the desired film property modifications. Changing the film properties of the reticle could also provide fine adjustments of CD or other critical structures patterned on the wafer.

Techniques for Altering Optical Properties of Reticle to Form Embedded Markings

Currently, adequate reticle markings for identifying reticle characteristics are not provided. A reticle is typically provided with a pattern of film, such as a patterned chromium layer, that was deposited on a substrate, such as a quartz, fused silica, or synthetic $SiO_2$ material. However, the reticle user will have no way of knowing the source of the reticle or information regarding the reticle's film properties, other than a label on the packaging in which the reticle was delivered. Since reticle costs are increasing, especially for extreme UV reticles, it is desirable to provide a marking mechanism to identify characteristics of the reticle.

Particular reticle manufacturers may provide simple marks. For example, reticle blank suppliers notch the corners of the reticle to crudely identify the most general characteristics of the reticle material. This notching techniques includes changing the chamfer of one or more corners of the reticle substrate. The notching scheme is typically unique to each reticle blank supplier with no formal standard utilized in the semiconductor fabrication industry. Some reticle manufacturers may also provide a mark in the film material itself. However, this type of mark is impermanent and may be etched away during a reticle repair process.

A technique for utilizing a focused ion beam (FIB) to mark or "pit" the surface of the reticle has also been proposed. However, this technique would result in depressions in the reticle surface which may trap contaminants. Also, an uneven surface may adversely affect techniques that reference the surface, for example, for writer tool leveling purposes. It is important that the surface reference be accurate within a few tens of nanometers.

In general, embodiments of the present invention utilize the laser correction tool to form markings within a reticle material. That is, the laser correction tool is used to form internal marks for identifying characteristics of the reticle. Examples of markings include bar codes, micro bar codes, dot matrix patterns, and alphanumeric characters. The laser correction tool may be used to place the markings below the surface at a depth that is readable by a human or with the aid of an optical tool. The markings are wholly contained below the reticle surface so that they can remain permanent and also not attract contaminants. For instance, polishing will not result in removal of the subsurface mark. In a specific embodiment, the marks are placed at least 1 mm below the reticle surface.

Figure 8A:
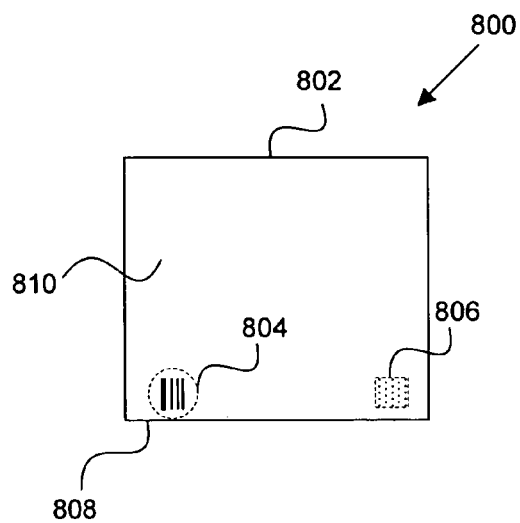
FIG. 8A is a diagrammatic top view of a reticle having bar code and dot matrix markings in accordance with one embodiment of the present invention.

FIG. 8A is a diagrammatic top view of a reticle 800 having a bar code mark 804 and dot matrix mark 806 in accordance with one embodiment of the present invention. As shown, the marks 804 and 806 are formed in a plane that is parallel to a top surface 810 of the reticle. The top surface is the surface that is to include the pattern (not shown) to be used to fabricate semiconductor wafers in a photolithography process. The bottom surface of the reticle that is opposite the top surface 810 may include an opaque coating.

Figure 8B:
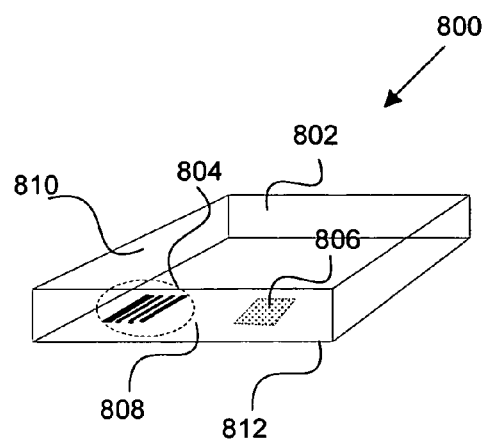
FIG. 8B is a diagrammatic perspective view of the reticle having bar code and dot matrix markings of FIG. 8A in accordance with one embodiment of the present invention.

FIG. 8B is a diagrammatic perspective view of the reticle 800 of FIG. 8A in accordance with one embodiment of the present invention. The marks 804 and 806 are shown from side 808 of reticle 800. As shown, the marks 804 and 806 are sandwiched between the top surface 802 and bottom surface 812 of reticle 800. Although the marks 804 and 806 are shown to be positioned half way between the top and bottom surfaces, of course, the marks may be at any suitable position, such as between 1 and 4 mm below the top surface 810. The marks may be read from the top or bottom surface and may also be placed near the top or bottom surface.

Figure 9A:
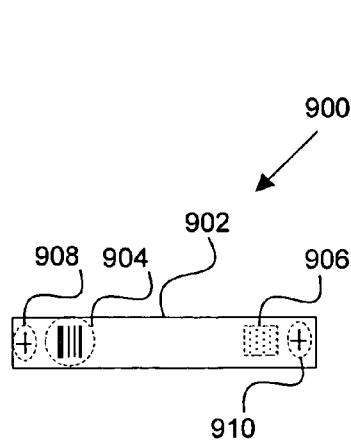
FIG. 9A is a diagrammatic side view of a reticle having bar code and dot matrix markings formed in a plane that is perpendicular to a patterned surface of the reticle in accordance with one embodiment of the present invention.
Figure 9B:
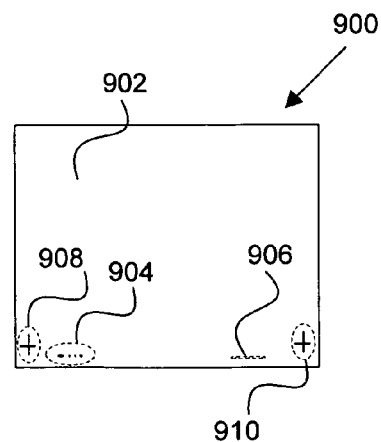
FIG. 9B is a diagrammatic top view of the reticle having bar code and dot matrix markings of FIG. 9A in accordance with one embodiment of the present invention.

Since the real estate of the top surface of a reticle is typically densely packed with device patterns, the laser correction tool may also be used to form one or more marks that are perpendicular to the patterned surface of the reticle. This technique may be especially suitable for extreme UV reticles on which an opaque film is formed on both top and bottom surfaces. FIG. 9A is a diagrammatic side view of a reticle 900 having a bar code mark 904 and a dot matrix mark 906 formed in a plane that is perpendicular to a patterned surface 902 of the reticle 900 in accordance with one embodiment of the present invention. In one implementation, the marks are positioned a distance of at least 1 mm (e.g., 1 to 4 mm) from one of the reticle edges. FIG. 9B is a diagrammatic top view of the reticle 900 of FIG. 9A in accordance with one embodiment of the present invention. As shown in FIG. 9B, the marks 904 and 906 use less space of the patterned surface 802 than the marks of FIGS. 8A and 8B.

The marks may identify any suitable reticle characteristics. For example, a mark may identify reticle manufacturer, reticle substrate and/or coating materials, lot number, melt number, film type, film characteristics such as composition and thickness, date and/or time of film deposit or removal, batch number of material, etc. Each reticle may also be serialized and identified with a unique serial number.

Identification of particular history information may be used to track root cause of a reticle problem with the substrate and/or film. For example, if a particular lot number is identified on a problematic reticle, the entire lot can be pulled and inspected to determine the precise root cause. Information may also be added in the form of marks over time, for example, to identify particular aspects of the reticle's use history. For instance, as each film is added or removed, the film's characteristics and date/time of deposit or removal may be recorded in an embedded mark in the reticle.

Additionally, some or all of this information may be encrypted for security reasons. Particular information may require encryption. For example, the marks may be utilized to identify a particular lithography tool recipe, e.g., the parameter settings of the wafer lithography tool. Recipe information may be read from a reticle mark, decrypted, and then used to set the operating parameters of the lithography tool for wafer printing. A mark may also identify particular measurement or inspection characteristics, such a inspection or metrology tool recipe, tool type, defect sensitivity settings, a reference to inspection/metrology results, a date and/or time of an inspection/metrology process. The mark may also be used to identify a set of lithography and/or measurement settings to be used in an aerial image measurement system to determine whether the repair a reticle prior to its use. In an aerial image measurement system, an image is typically simulated from the reticle pattern (or design data) and then lithography and measurement tool settings are simulated to simulate fabrication and measurement of a wafer prior to fabrication of such wafer. The simulated results are then analyzed to determine whether to repair the reticle prior to use. The mark can be used to provide any suitable information for use in an aerial image measurement system to automate the process.

The laser correction tool may also be used to form different planes of marks, and these different levels of marks may be on top of each other. An optical tool's numerical aperture may then be adjusted to focus at different depths in the reticle and thereby read different marks at specific levels.

Reference marks could also be incorporated into a blank reticle to facilitate a coordinate reference system. When defects are found on the blank reticle using an inspection tool, these reference marks can then be used to locate such defects with another review, repair, or analysis tool. Since different tools use different physical reference points (i.e., different edges) and the substrate size varies, e.g., sometimes up to 100's of microns, the task of relocating the defects for analysis becomes very difficult. For instance, sometimes a very large search window is required and it becomes difficult to find the rather small defect in such a large window. Accordingly, reference marks may be placed in a blank reticle with the laser correction tool and defects located with respect to such reference marks. As shown in FIGS. 9a and 9b, reference marks 908 and 910 may be placed in the reticle. In this embodiment, two marks 908 and 910 are utilized so as to be able to rotate the reticle to a particular position with respect to the two marks, and these two marks are shaped so as to be optically detected from the top surface (or bottom surface) and side surface of the reticle. In the illustrated example, each reference mark is shaped like a child's jack. Of course, any suitable shape and number of reference marks may be utilized. For example, two reference marks that are viewable only from the top or bottom surface of the reticle may be utilized. In one embodiment, the marks are only viewable from the bottom surface of the reticle because the top surface is coated with an opaque material. Alternatively, the reference marks are viewable only from a side surface of the reticle and not from any other surface.

Computer System Description

A system configured to perform one or more of the techniques described herein includes a computer system. The computer system may be configured to include a carrier medium. The carrier medium may be coupled to, or included in the computer system using any method or device known in the art. Program instructions implementing methods such as those described herein may be transmitted over or stored on the carrier medium. The carrier medium may be a transmission medium such as a wire, cable, or wireless transmission link, or a signal traveling along such as ire, cable, or link. The carrier medium may also be a storage medium such as a read-only memory, a random access memory, a magnetic or optical disk, or a magnetic tape.

In an embodiment, the computer system may be configure to execute the program instructions to perform a computer-implement method according to any the above embodiments. In general, the term "computer system" may be broadly defined as any device having one or more processors, which executes instructions form a a memory medium.

The program instructions may be implemented in any of various ways, including procedure-based techniques, component-based techniques, and/or object-oriented techniques, among others. For example, the program instructions may be implemented using ActiveX controls, C++ objects, Java-Beans, Microsoft Foundation Classes ("MFC"), or other technologies or methodologies, as desired. The system may be further configured as described herein.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of widening a process window of a reticle that is used to fabricate a layer on a semiconductor wafer, the method comprising:
    providing a map indicating a plurality of optical property adjustments at a plurality of locations on a reticle; and
    adjusting an optical property of the reticle at each of the plurality of locations based the optical property adjustments of the provided map, wherein the adjustment is accomplished by using an optical beam,
    wherein the optical property adjustments serve to widen the process window of the reticle, and
    wherein the optical property is a dose level, an illumination angle, birefringence, or a property of a film disposed on the reticle.

2. A method as recited in claim 1, wherein the optical beam is a femto-second laser.

3. A method as recited in claim 1, wherein the optical property is illumination angle.

4. A method as recited in claim 3, wherein the adjusting an optical property of the reticle at each of the plurality of locations substantially causes different illumination angles at different locations of the reticle.

5. A method as recited in claim 4, wherein a first location is embedded with a first away of scattering elements and a second location is embedded with a second array of scattering elements, wherein the first array has different spacing than the second away so that the first location causes a different illumination angle than the second location.

6. A method as recited in claim 1, wherein the adjusting an optical property of the reticle at each of the plurality of locations substantially minimizes critical dimension error of a semiconductor wafer produced with such adjusted reticle.

7. A method as recited in claim 6, wherein the critical dimension error includes an overlay error.

8. A method as recited in claim 1, wherein the optical property is birefringence.

9. A method as recited in claim 8, wherein the adjusting an optical property of the reticle at each of the plurality of locations substantially minimizes birefringence caused by the reticle.

10. A method as recited in claim 9 wherein the reticle's transparent material is modified in a first direction in a different way than a second direction to minimize birefringence, wherein the first direction is orthogonal to the first direction.

11. A method as recited in claim 10, wherein a femto-second laser is used to embed scattering centers that have a different configuration in the first direction than the second direction.

12. A method as recited in claim 1, wherein the optical property is a film property of the reticle's pattern and the operation of adjusting an optical property of the reticle at each of the plurality of locations is accomplished by directing the optical beam at an interface between a film on the reticle and a transparent portion of the reticle.

13. A method as recited in claim 12, wherein the optical beam is produced by a femto-second laser.

14. A method as recited in claim 13, wherein the film property is changed for the reticle's entire film.

15. A method as recited in claim 13, wherein the film property is changed only for specific locations of the reticle's entire film.

16. A method as recited in claim 13, wherein the femto-second laser is directed at a side of the reticle on which the film is disposed.

17. A method as recited in claim 13, wherein the femto-second laser is directed at a side of the reticle that is opposite as side on which the film is disposed.

18. A method as recited in claim 12, wherein the operation of adjusting an optical property of the reticle at each of the plurality of locations is accomplished so as to adjust a critical feature on a wafer fabricated with such reticle.

19. A method as recited in claim 1, wherein the optical beam is transmitted through a first side of the reticle that is opposite a second side on which a pattern is formed.

20. A method as recited in claim 1, wherein the optical beam is transmitted through a side of the reticle on which a pattern is formed.

21. A method as recited in claim 1, wherein the optical properties of the reticle at each of the plurality of locations are adjusted prior to patterning the reticle.

22. A method as recited in claim 1, wherein the map indicating a plurality of optical property adjustments is obtained from a reticle inspection results.

23. A method as recited in claim 1, wherein the map indicating a plurality of optical property adjustments is obtained from a wafer inspection results.

24. A method as recited in claim 1, wherein the map indicating a plurality of optical property adjustments is obtained from predictive modeling results.

25. A method as recited in claim 1, wherein the map indicating a plurality of optical property adjustments is obtained from predictive modeling results and inspection results.

26. A method of providing one or more marks on a reticle for use in fabricating a semiconductor wafer, comprising:
    using an optical beam to form one or marks embedded in the reticle,
    wherein the one or more marks are below each surface of the reticle and include a plurality of structures that are arranged to identify one or more reticle characteristics of the reticle,
    wherein each mark is positioned so as to be substantially permanent and readable by an optical tool and/or a human.

27. A method as recited in claim 26, wherein the optical beam is a femto-second laser.

28. A method as recited in claim 26, wherein the reticle characteristics include one or more of the following: a reticle manufacturer a reticle substrate and/or one or more coating materials a lot number, a melt number, a film type, one or more film characteristics such as composition and thickness, a date and/or time of film deposit or removal, a batch number of a material, or a serial number for uniquely identifying the reticle.

29. A method as recited in claim 27, wherein each of the one or more marks takes the form of one or more of the following: a bar code, a micro bar code, a dot matrix, or a set of alphanumeric characters.

30. A method as recited in claim 27, wherein each mark is placed at least 1 mm below each surface of the reticle.

31. A method as recited in claim 27, wherein at least one mark is positioned within a plane that is parallel to a patterned surface of the reticle.

32. A method as recited in claim 27, wherein at least one mark is positioned within a plane that is perpendicular to a patterned surface of the reticle.

33. A method as recited in claim 32, wherein the reticle is a extreme UV (ultra-violet) reticle.

34. A method as recited in claim 26, wherein at least a portion of the marks is encrypted.

35. A method as recited in claim 34, wherein one or more of the marks further identify one or more of the following: a lithography tool recipe, a metrology tool recipe, an inspection tool recipe, a process tool recipe, or aerial measurement system information.

36. A method as recited in claim 34, further comprising automating a lithography, metrology, inspection, aerial measurement or fabrication process based on at least a portion of the marks.

37. A method as recited in claim 28, further comprising identifying a root cause of a reticle problem based at least in part on the marks.

38. A method as recited in claim 28, wherein the marks are arranged in a plurality of layers.

39. A method as recited in claim 26, wherein the one or more marks provide one or more reference locations that can be used to locate a defect on such reticle.

* * * * *

UNITED STATES PATENT AND TRADEMARK OFFICE
CERTIFICATE OF CORRECTION

PATENT NO. : 7,303,842 B2  
APPLICATION NO. : 11/394901  
DATED : December 4, 2007  
INVENTOR(S) : Watson et al.

It is certified that error appears in the above-identified patent and that said Letters Patent is hereby corrected as shown below:

Column 19, line 29 change "away" to --array--.

Column 19, line 31 change "away" to --array--.

Signed and Sealed this

Nineteenth Day of August, 2008

JON W. DUDAS  
*Director of the United States Patent and Trademark Office*